United States Patent
Duplain et al.

(10) Patent No.: US 7,759,633 B2
(45) Date of Patent: Jul. 20, 2010

(54) OPTICAL SENSOR FOR MONITORING ELECTRICAL CURRENT OR POWER

(75) Inventors: Gaétan Duplain, Beauport (CA); Claude Belleville, L'Ancienne-Lorette (CA)

(73) Assignee: Opsens Inc., Québec, Québec (CA)

( * ) Notice: Subject to any disclaimer, the term of this patent is extended or adjusted under 35 U.S.C. 154(b) by 0 days.

(21) Appl. No.: 11/685,493

(22) Filed: Mar. 13, 2007

(65) Prior Publication Data

US 2007/0211249 A1  Sep. 13, 2007

Related U.S. Application Data

(60) Provisional application No. 60/781,383, filed on Mar. 13, 2006.

(51) Int. Cl.
- G01J 1/04 (2006.01)
- G01J 1/42 (2006.01)
- G01J 5/08 (2006.01)

(52) U.S. Cl. .............. 250/227.11; 324/96; 324/106; 374/161

(58) Field of Classification Search ......... 250/227.11; 356/300, 303, 319; 385/12; 324/96, 105, 324/106; 374/16–19, 159, 161, 162
See application file for complete search history.

(56) References Cited

U.S. PATENT DOCUMENTS

| | | | |
|---|---|---|---|
| 4,689,483 A * | 8/1987 | Weinberger | 250/227.23 |
| 4,790,669 A | 12/1988 | Christensen | |
| 5,004,913 A * | 4/1991 | Kleinerman | 250/227.21 |
| 5,021,731 A | 6/1991 | Saaski et al. | |
| 5,145,257 A | 9/1992 | Bryant et al. | |
| 5,668,342 A * | 9/1997 | Discher | 86/50 |
| 6,019,507 A * | 2/2000 | Takaki | 374/161 |
| 6,116,779 A * | 9/2000 | Johnson et al. | 374/161 |
| 6,456,863 B1 * | 9/2002 | Levin et al. | 600/374 |
| 2004/0182998 A1 * | 9/2004 | Denney et al. | 250/227.14 |

* cited by examiner

Primary Examiner—Thanh X Luu
Assistant Examiner—Francis M Legasse, Jr.
(74) Attorney, Agent, or Firm—C. Marc Benoit; Benoit & Côtés.e.n.c.

(57) ABSTRACT

The present invention provides an optical sensor for monitoring current or power in a monitored element of a device such as a bridge-wire or hot-wire of electro-explosive devices. The optical sensor comprises an optical sensor made of semiconductor material. The semiconductor material comprises an absorption edge which is sensitive to a temperature variation. The semiconductor material is for placing in thermal contact with the monitored element of the device, whereby, when the current or power varies in the monitored element, it causes a variation in temperature in the semiconductor element and hence a spectral shift of the absorption edge which can be measured and which is representative of current and power variation.

19 Claims, 8 Drawing Sheets

OPTICAL SENSOR FOR MONITORING ELECTRICAL CURRENT OR POWER

CROSS-REFERENCE TO RELATED APPLICATIONS

This application claims priority under 35 USC §119(e) of U.S. provisional patent application 60/781,383 filed Mar. 13, 2006, the specification of which is hereby incorporated by reference.

TECHNICAL FIELD

The present invention relates to electrical current or electrical power sensors and, more specifically, to sensors used for monitoring electrical current or electrical power on electro-explosive devices.

BACKGROUND OF THE ART

Various electrical current and electrical power sensors, based on direct or indirect electrical measurement methods, are readily available on the market. An old method still in use today consists of measuring the voltage drop across a resistor placed in the current path. There also exist more sophisticated techniques based on the Hall effects or magnetoresistive effects. Although these electrical measurement methods have been widely used, there are still today specific applications where they fail to provide correct measurements.

For example, these types of sensors often cannot be used in presence of strong electromagnetic fields or in high voltage environments. More particularly, these types of sensors are generally not well adapted for the assessment of electro-explosive devices (EED). Bridge-wire or hot-wire EED are used to initiate explosive components in ordnance and car airbag, for example. Current from an external source is applied to the resistive bridge-wire to raise its temperature, which in turn heats up the explosive components to its ignition point. EEDs are susceptible to initiation by electromagnetic fields as a result of current induced in the EED circuit. This can happen, for example, when the EED is located closed to high power communication system and radar transmitter. For safety reasons, the compatibility assessment of these devices is of great importance.

Several methods have been developed to measure the temperature rise in the EED bridge-wire due to the presence of strong electromagnetic (EM) fields. The most common one has been to use a thermocouple located in close proximity to the bridge-wire. This method has disadvantages: the response of the thermocouple sensor may be altered by the presence of EM fields and alternatively, the electrical leads of this sensor may alter the EM field under which the EED is being tested. Other methods have been described in the prior art to circumvent these problems. Most of these methods are based on the use of an optical sensor. U.S. Pat. No. 5,145,257 to Bryant et al. discloses the use of a temperature sensor comprising a probe, infrared fiber, super-cooled detector and associated electronics. Temperature rise of the bridge wire is measured by detecting the infrared light radiation emitted by the bridge-wire. This method suffers from poor sensitivity, authors claiming a sensitivity of 20 dB below the no fire threshold (NFT) point while acceptable sensitivity required for ordnance components is in the range of 35 dB.

Another proposed method consists of using a phosphorescent material. This material is located nearby or in contact with the bridge-wire. This material is exited by an external light source and its fluorescent decay time, which depends of temperature, is measured with an optical detector. One of the drawbacks of this technique is its slow response time.

A further method also described in the prior art uses a layer of transparent material whose refractive index varies with temperature. This material is sandwiched between two or more layers of reflective material. This sensor assembly forms a Fabry-Perot interferometer and is placed at the tip of an optical fiber. Light is sent to the sensor assembly which is located nearby or in contact with the bridge-wire. The spectrum of the reflected light is modulated according to refractive index variation due to temperature increase in the bridge wire. This spectrum modulation is measured by interferometric or spectrophotometric methods. This method comes with drawbacks as it is based on an interferometric principle. Among others, the method suffers form great sensitivity to mechanical vibration and optical fiber movement due to induced modal noise in the multimode optical fiber.

U.S. Pat. No. 5,021,731 Saaski et al. discloses the use of a thermo-optical sensor for measuring the current flowing between a pair of conductors. The sensor includes an optical sensing element having a resistive or semiconductive electrical property and an optical property that is function of temperature. The disadvantage of this method is that the electrical property of the sensing element may be affected by the presence of strong EM fields. These fields may also induced current in the electrical conductors that connect to the sensing element therefore giving false measurements.

U.S. Pat. No. 4,790,669 to Christensen discloses a temperature optical sensor. The optical sensor uses a semiconductor sensor having an optical absorption edge which is characteristic of the semiconductor material and is variable as a function of the temperature. Various optical arrangements are provided.

SUMMARY OF THE INVENTION

According to one aspect of the invention, there is provided an optical sensor for monitoring current or power in a monitored element of a device such as a bridge-wire or hot-wire of electro-explosive devices. The optical sensor comprises an optical sensor made of semiconductor material. The semiconductor material comprises an absorption edge which is sensitive to a temperature variation. The semiconductor material is for placing in thermal contact with the monitored element of the device, whereby, when the current or power varies in the monitored element, it causes a variation in temperature in the semiconductor element and hence a spectral shift of the absorption edge which can be measured and which is representative of current and power variation.

According to another aspect of the invention, there is provided an optical sensor system for monitoring an electrical current or power in an element to be monitored. The optical sensor system comprises an optical sensor, an optical fiber, a spectrophotometer and a processing unit. The optical sensor has a temperature sensitive element made of a semiconductor material having a transition in its optical absorption spectrum. A spectral position of the transition varies with temperature. The temperature sensitive element is to be placed in thermal contact with a surface of a continuous portion of the monitored element. The optical fiber is for guiding light to the optical sensor and for collecting light propagated in the optical sensor. The spectrophotometer is for measuring an optical absorption spectrum of the propagated light. The processing unit is for determining the spectral position of the transition in the measured optical absorption spectrum, and for converting the spectral position into a measurement of the current or power.

According to another aspect of the invention, there is provided an optical sensor system for monitoring an electrical current or power in a bridge-wire of an electro-explosive device. The optical sensor system comprises a bridge-wire for installation in the electro-explosive device, an optical sensor having a temperature sensitive element, an optical fiber for guiding light to the optical sensor and for collecting light propagated in the optical sensor, a spectrophotometer for measuring an optical absorption spectrum of the propagated light, and a processing unit. The temperature sensitive element has a transition in its optical absorption spectrum, a spectral position of the transition varying with temperature. The temperature sensitive element is placed in thermal contact with a surface of a continuous portion of the bridge-wire. The processing unit is for determining the spectral position of the transition in the measured optical absorption spectrum, and for converting the spectral position into a measurement of the current or power in the bridge-wire.

According to another aspect of the invention, there is provided a method for monitoring at least one of an electrical current and an electrical power in an element to be monitored. A temperature sensitive element is placed in thermal contact with a surface of a continuous portion of the monitored element. A temperature of the monitored element is representative of an electrical current and/or power in the monitored element. Light is guided to the optical sensor and light propagated in the optical sensor is collected using an optical fiber. An optical absorption spectrum of the propagated light is measured. A spectral position of a transition in the measured optical absorption spectrum is determined. The spectral position varies with the temperature of the monitored element. The spectral position is converted into a measurement of the current/power using a known relation between the spectral position and the current/power. Finally, the measurement of the current/power is outputted.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
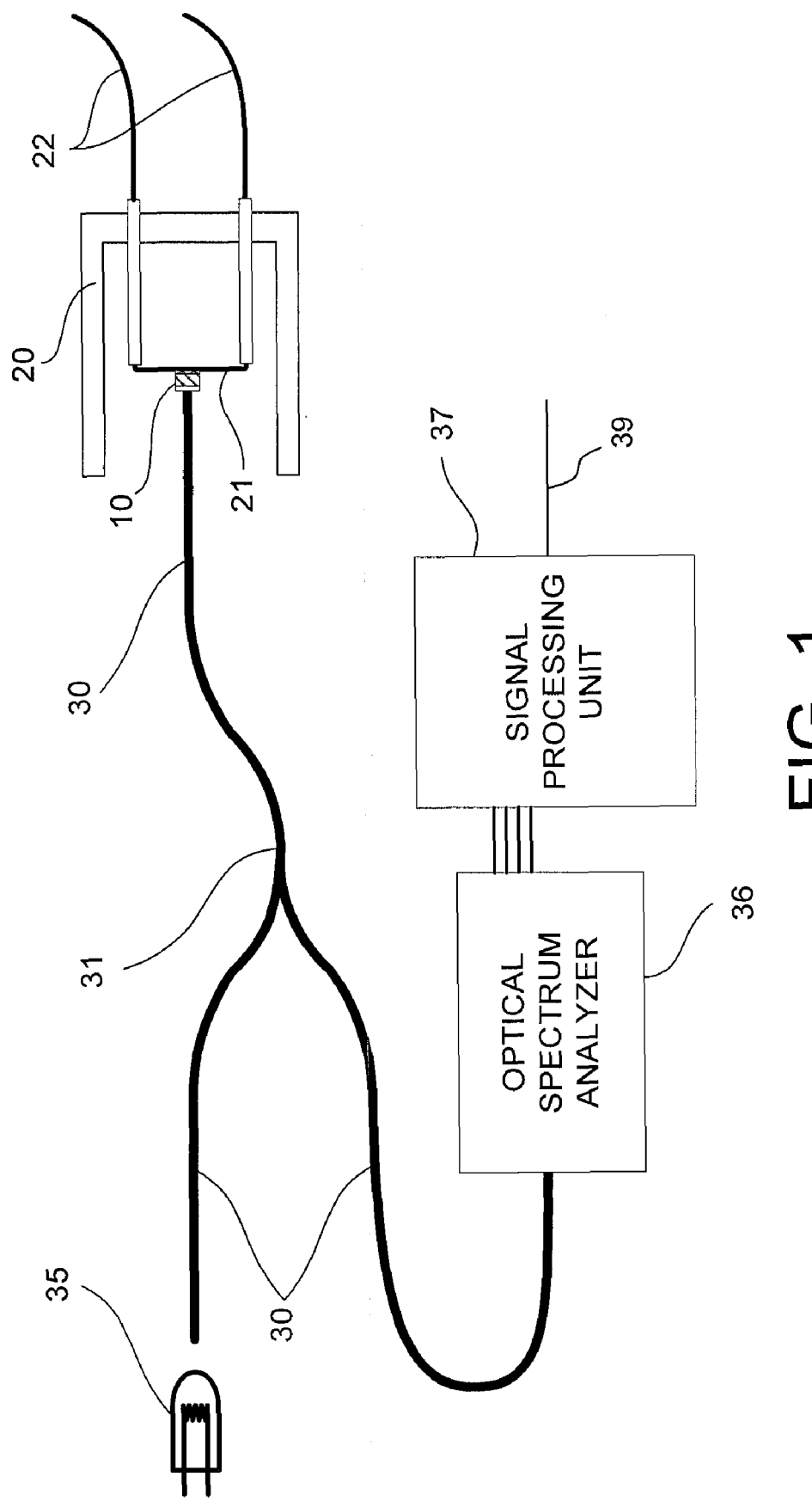
FIG. 1 is a schematic diagram showing an optical current and power sensor system according to an embodiment of the invention.
Figure 2:
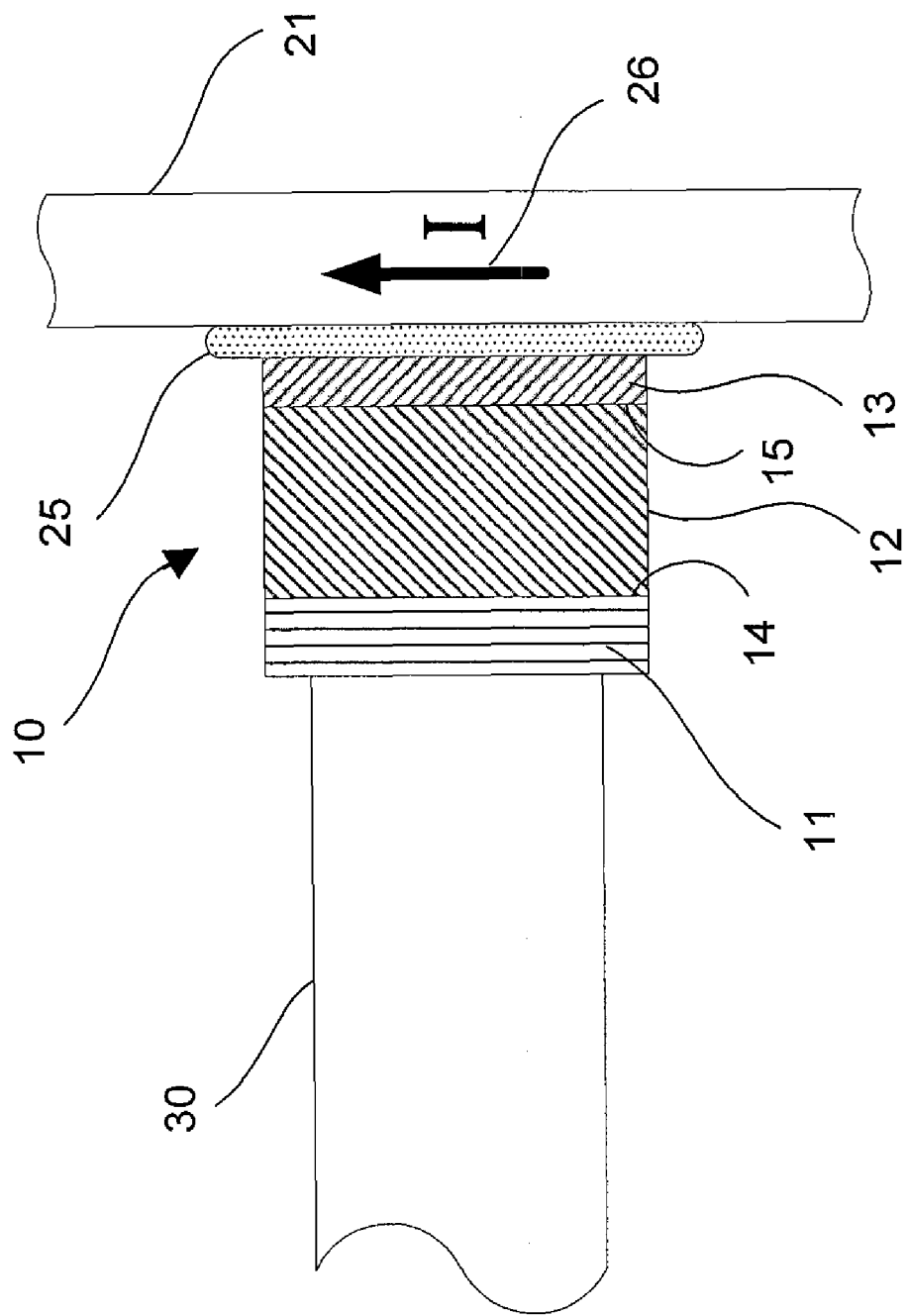
FIG. 2 is a side cross-sectional view of the optical sensor of the system of FIG. 1.
Figure 3:
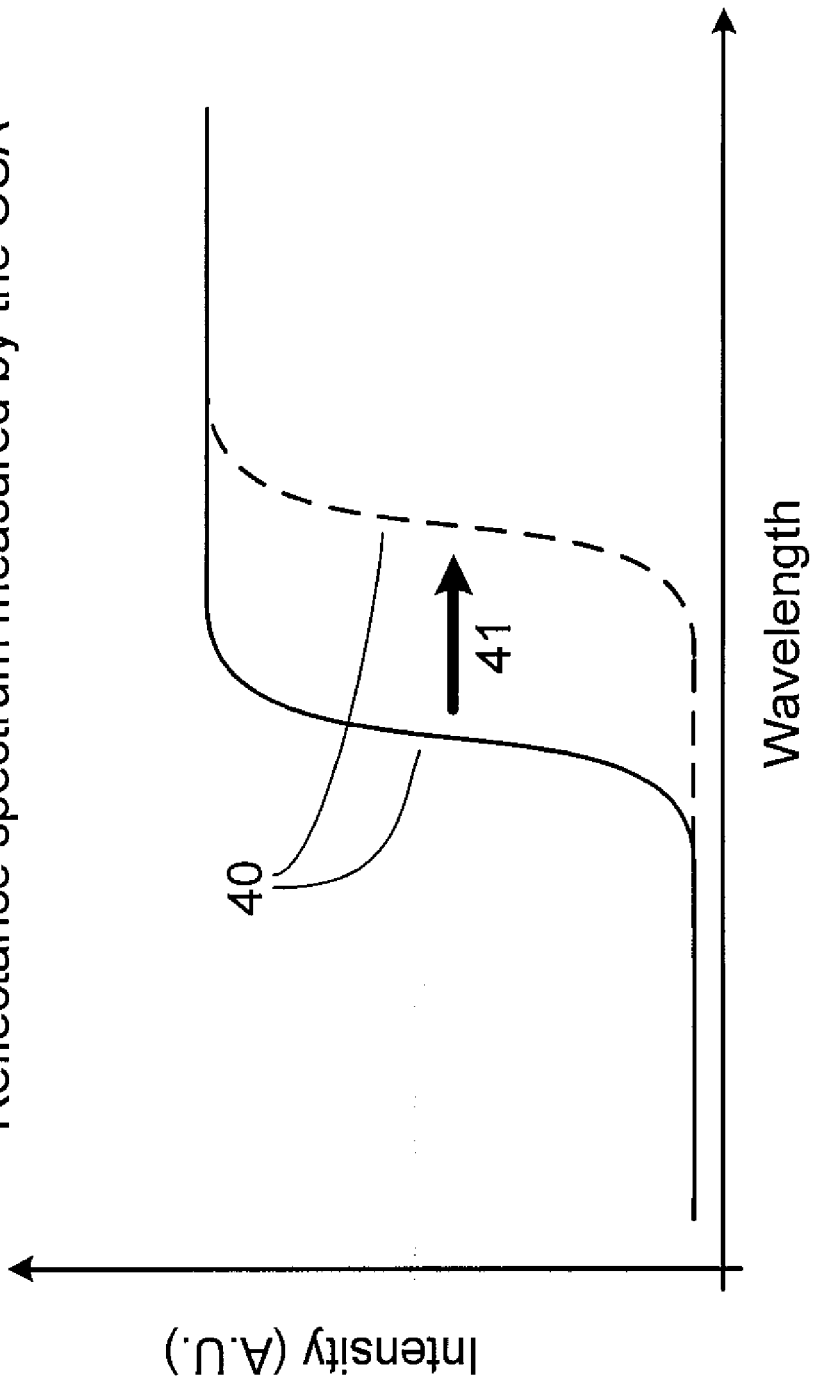
FIG. 3 is a graph depicting the temperature-induced spectral shift of the absorption edge of the semiconductor material used in the sensor of FIG. 2.

Referring to FIGS. 1, 2 and 3, a simple optical sensor for monitoring electrical current and power uses a temperature sensitive element 12 (forming part of the optical sensor 10 of FIG. 1) which has a characteristic in its optical absorption spectrum which varies with temperature. More specifically, the temperature sensitive element 12 is made of a semiconductor material having a transition, e.g. an edge, the spectral position of the optical absorption edge varying with temperature. The optical sensor 10 is put in thermal contact with the element 21 of the device 20 to be monitored. In an example, the monitored element 21 shown in FIG. 1 is a bridge-wire of an electro-explosive device 20. Current flowing through (or power dissipated by) the bridge-wire 21 of the monitored electro-explosive device 20 is monitored by measuring the spectral shift 41 of the semiconductor absorption edge 40 (see FIG. 3) caused by the temperature increase of the bridge-wire 21 of the monitored electro-explosive device 20. The temperature sensitive element 12 of the optical sensor 10 can be a direct bandgap semiconductor such as Gallium Arsenide or an indirect bandgap semiconductor such as Silicon. This sensor, based on a spectrophotometric measurement method, is particularly well suited for monitoring the current in electro explosive devices (EED).

One embodiment of the optical sensor 10 which is shown in FIG. 2 includes a single layer or multilayer antireflection optical coating 11 applied to the front surface 14 of the semiconductor element 12 and a single layer or multilayer high reflection optical coating 13 applied to the back surface 15 of the semiconductor element 12. These optical coatings significantly increase the reflected light signal intensity and contrast of the optical sensor 10.

Now referring to FIG. 1, an optical sensor system for monitoring electrical current or power comprises a light source 35 such as, but not limited too, a filament light source or a LED light source which optical spectrum is wide enough to cover the spectral shift range of the measurements. A set of optical fibers 30 and an optical coupler 31 optically connect the optical sensor 10 to the light source 35 and to an optical spectrum analyser (OSA) 36. Light provided by the light source 35 is guided to the optical sensor 10 through the optical coupler 31. The light then propagates through the optical sensor 10, including the temperature sensitive element 12 and is reflected on the back surface of the optical sensor 10, back to the optical fibers 30 and is guided to the OSA 36 by the optical coupler 31. The OSA 36 measures the spectral intensity distribution (i.e. the optical spectrum) of the light reflected by the optical sensor 10 to determine the optical absorption spectrum of the optical sensor 10. A signal processing unit 37 receives a signal representative of the measured optical absorption spectrum from the OSA 36 and processes the optical spectrum signal. From the measured optical absorption spectrum, the processing unit 37 determines the spectral position of the absorption edge and accordingly the temperature of the monitored element 21. The temperature measurement is outputted by the processing unit 37 in an output signal 39. Alternatively, this temperature measurement can be further processed to be converted into current measurement or power measurement knowing the current versus temperature response of the monitored element 21. Accordingly, one ore more of the temperature measurement, the current measurement and the power measurement are outputted in the output signal 39.

Referring to FIG. 2, the optical sensor 10 can be put in direct contact with the monitored element 21 or in indirect contact using a thermally conductive material 25. This thermally conductive material can be also an adhesive for further mechanical robustness. The optical sensor 10 is preferably bonded to the tip of the optical fiber 30 although a ferrule arrangement or focussing optics can alternatively be used.

Figure 4:
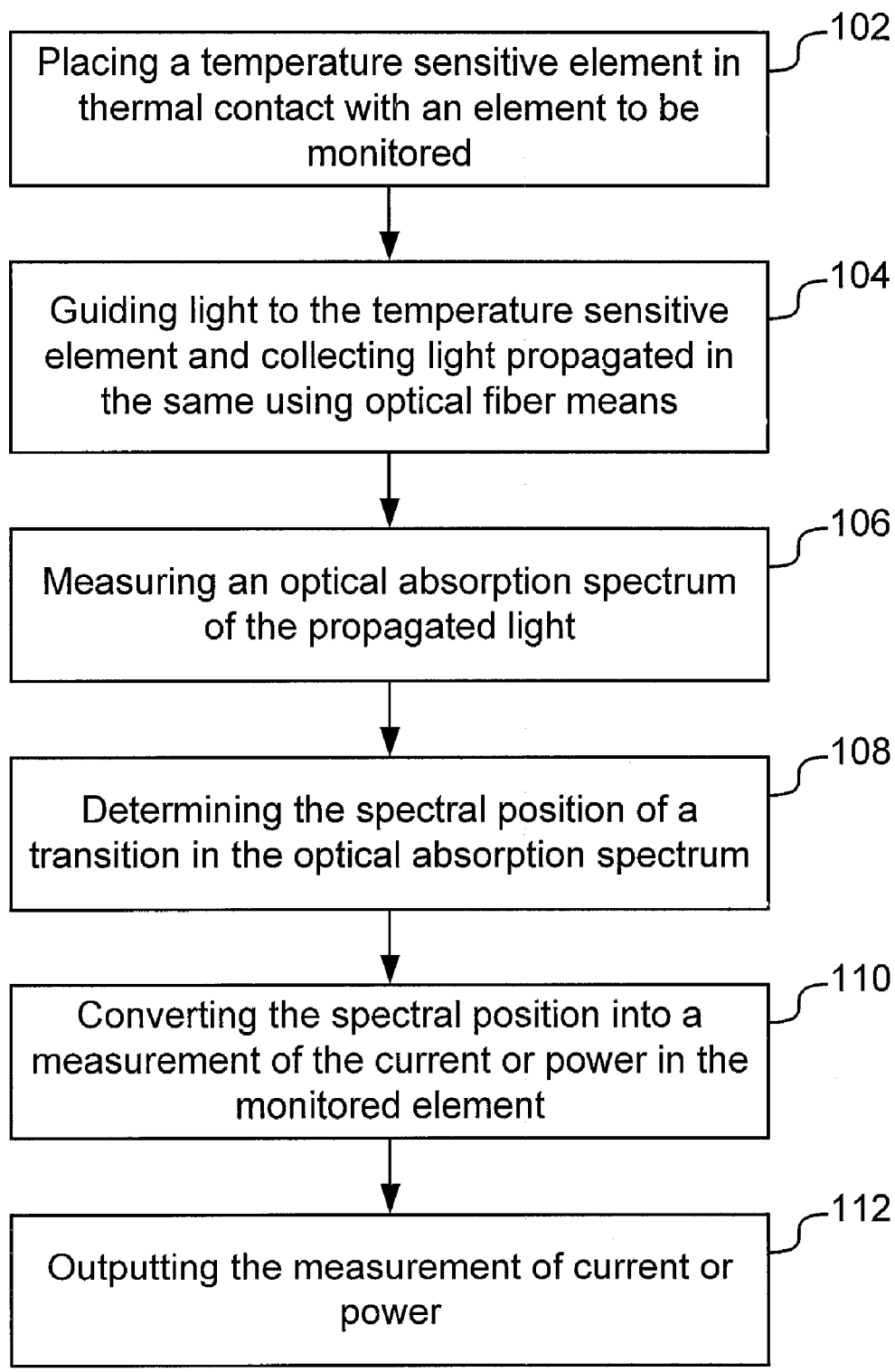
FIG. 4 is a flowchart illustrating a method for monitoring a current or power in a monitored element using the system of FIG. 1.

Now referring to FIG. 4, an temperature sensitive element 12 is placed in thermal contact with the monitored element 21 in step 102. As the electrical current 26 flow through the monitored element 21, power is dissipated by Joules effect thereby increasing the temperature of the monitored element 21 and therefore that of the optical sensor 10. Consequently, the absorption edge 40 of the semiconductor element 12 is spectrally shifted. In step 104, light from the light source 35 is guided to the temperature sensitive element 12 and light propagated in the temperature sensitive element 12 is collected using optical fiber means, e.g. the set of optical fibers 30 and an optical coupler 31. In step 106, the optical absorption spectrum of the semiconductor element 12 including a spectral shift 41 of its absorption edge 40 is measured using a spectrophotometer consisting of the light source 35 and the optical spectrum analyser 36 and the optical absorption spectrum is recorded by the optical spectrum analyser 36. In step 108, a signal processing unit 37 processes the optical absorption spectrum recorded by the OSA 36 and determines the spectral position of the absorption edge. In step 110, the signal processing unit 37 converts the spectral position into a measurement of current or power. First, using temperature versus spectral position calibration data, the signal processing unit 37 converts the spectral position measurements into temperature measurements. Second, if electrical current/power versus temperature difference calibration data are provided to the signal processing unit 37, the temperature measurements can be converted into electrical current or power measurement units. Accordingly, in step 112, an output signal 39 representative of one or a plurality of the temperature measurement, the electrical current measurement and the electrical power measurement is outputted. For example, the output signal 39 can be transmitted to a further system or component, or the temperature, electrical current or electrical power measurement can be saved on file for later retrieval.

Now referring to FIGS. 5 to 8, experimental measurements were conducted using a measurement setup similar to that illustrated in FIG. 1. The semiconductor material of the optical sensor is undoped gallium arsenide (GaAs) monocrystal. The bridge-wire EED has an NFT point of 300 mA.

Figure 5:
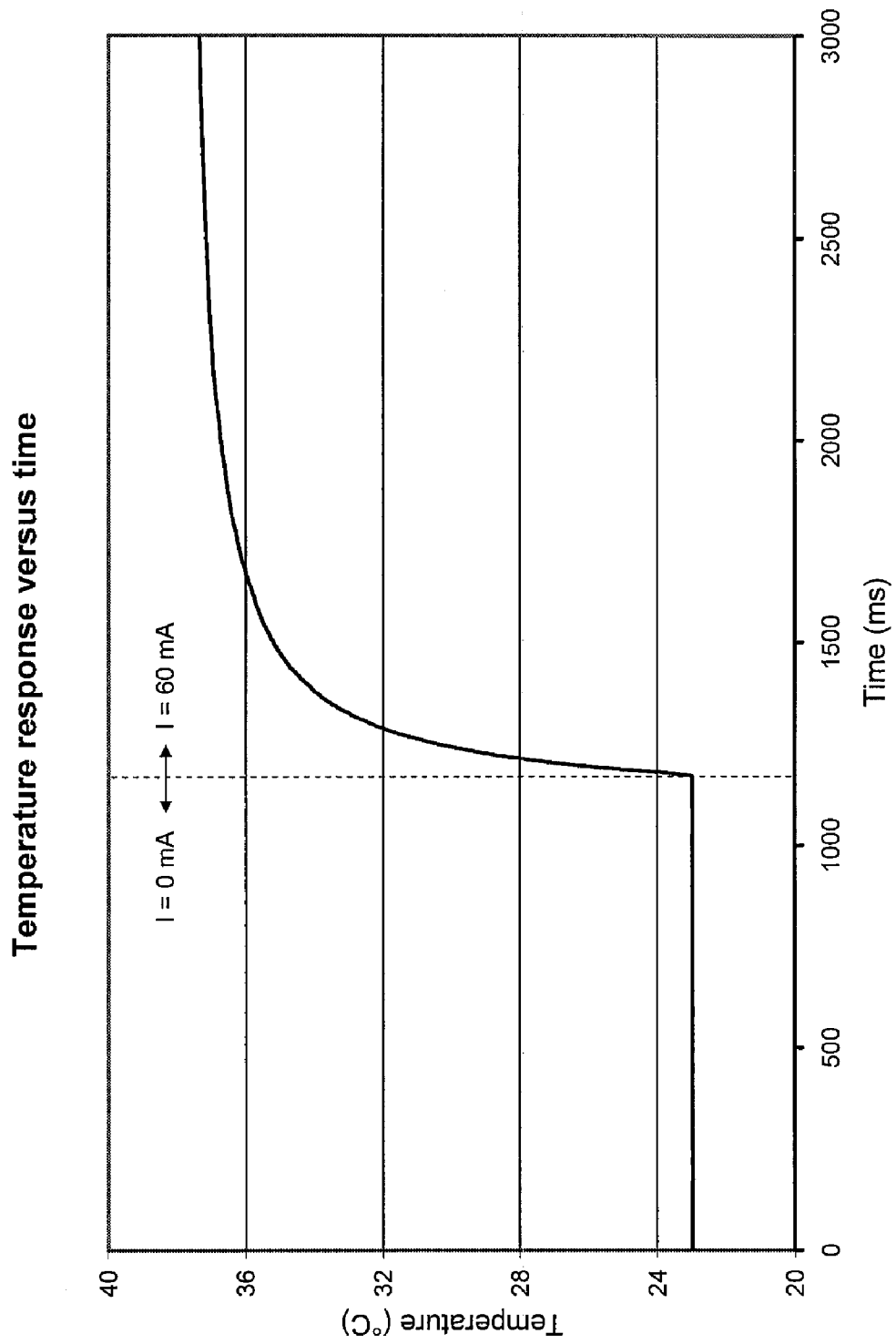
FIG. 5 is a graph illustrating the experimental measurement of the temperature response of the optical sensor to 60 mA current step applied to a bridge-wire EED.

FIG. 5 shows the experimental measurement of the temperature response of the optical sensor 10 to 60 mA current step applied to a bridge-wire EED. The sampling rate of the measurements is 1000 Hz. The graph of FIG. 4 shows a step response very similar to a first-order system as predicted by theoretical heat transfer model. The measured time constant is the range of 200 milliseconds, fast enough for EED assessment applications. The spectral position of the absorption edge is a specific characteristic of semiconductors and does not vary with time or with different manufacturing lot of the semiconductor material. Therefore the method provides an absolute temperature measurement which does not require individual sensor calibration. This spectrophotometric measurement method is not sensitive to modal noise induced by mechanical vibrations applied to the optical fiber. This sensor can be used in strong electromagnetic field environment. Unlike other sensors described in prior art, it has no conductive elements such as electrical leads, and therefore will not be affected by, or will not alter, electromagnetic fields.

Figure 6:
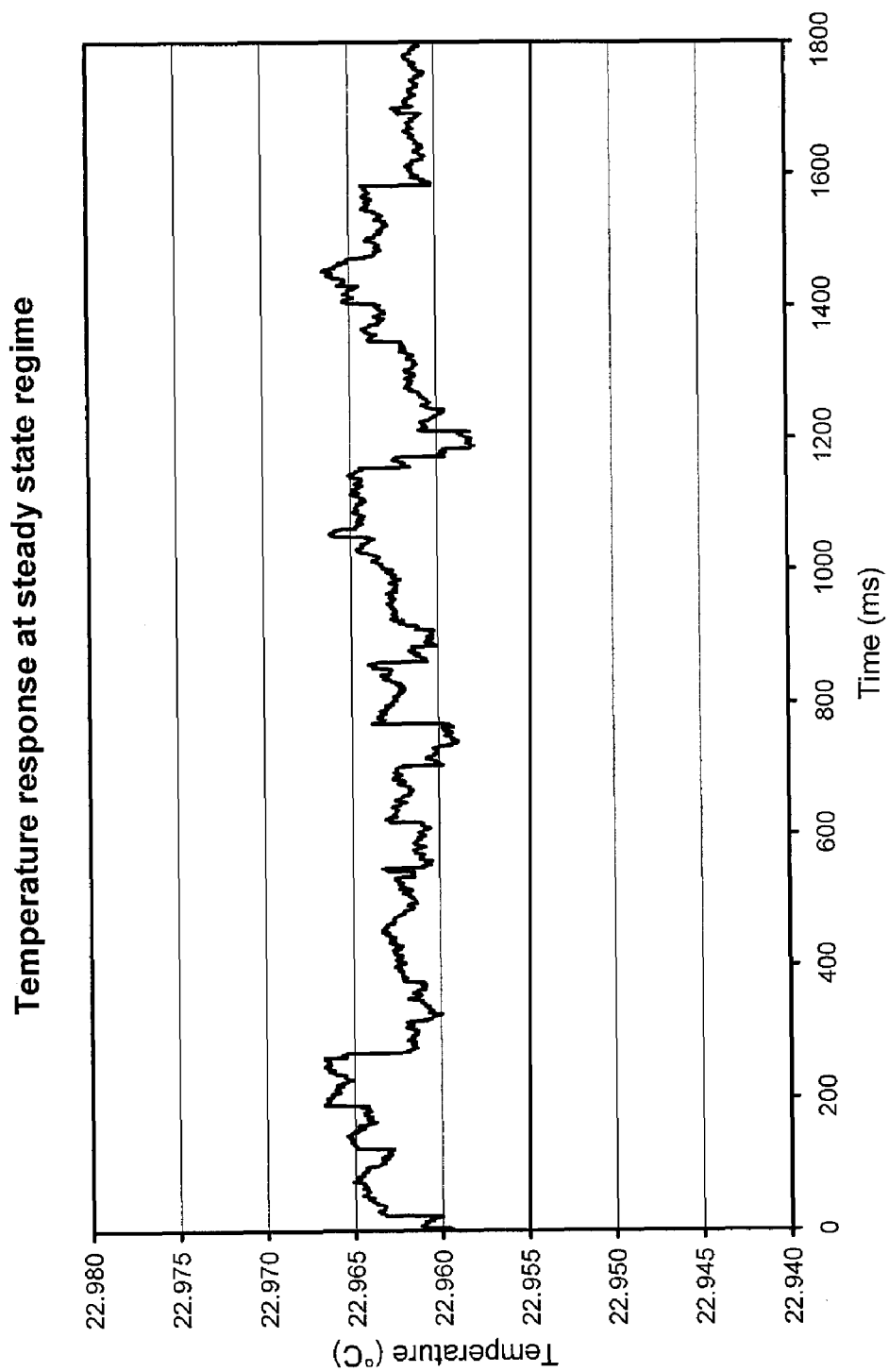
FIG. 6 is a graph illustrating the experimental measurement of the temperature response of the optical sensor in a steady state regime.
Figure 7:
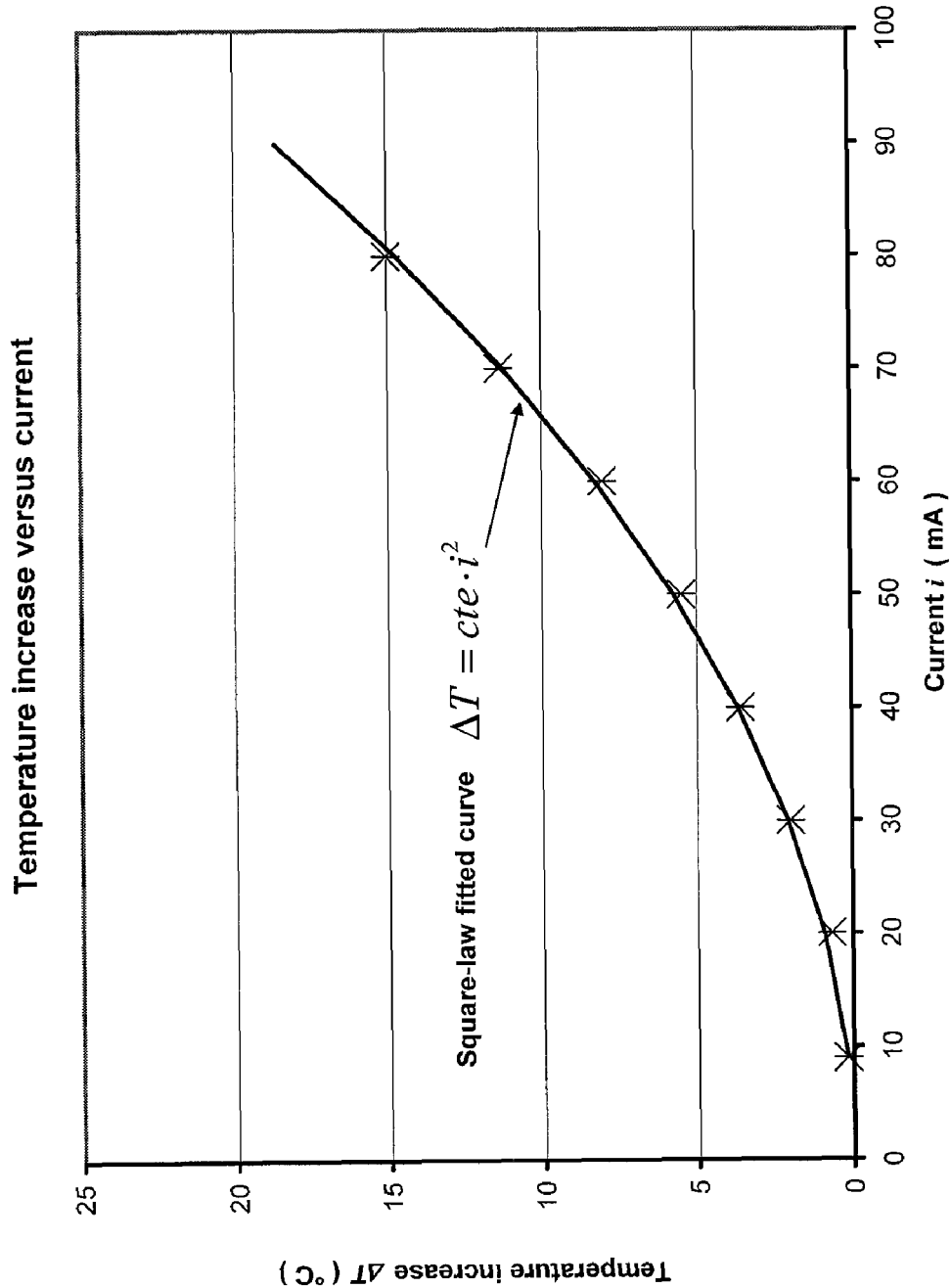
FIG. 7 is a graph illustrating the experimental measurement of the temperature response of the optical sensor as a function of the current in the bridge-wire EED.
Figure 8:
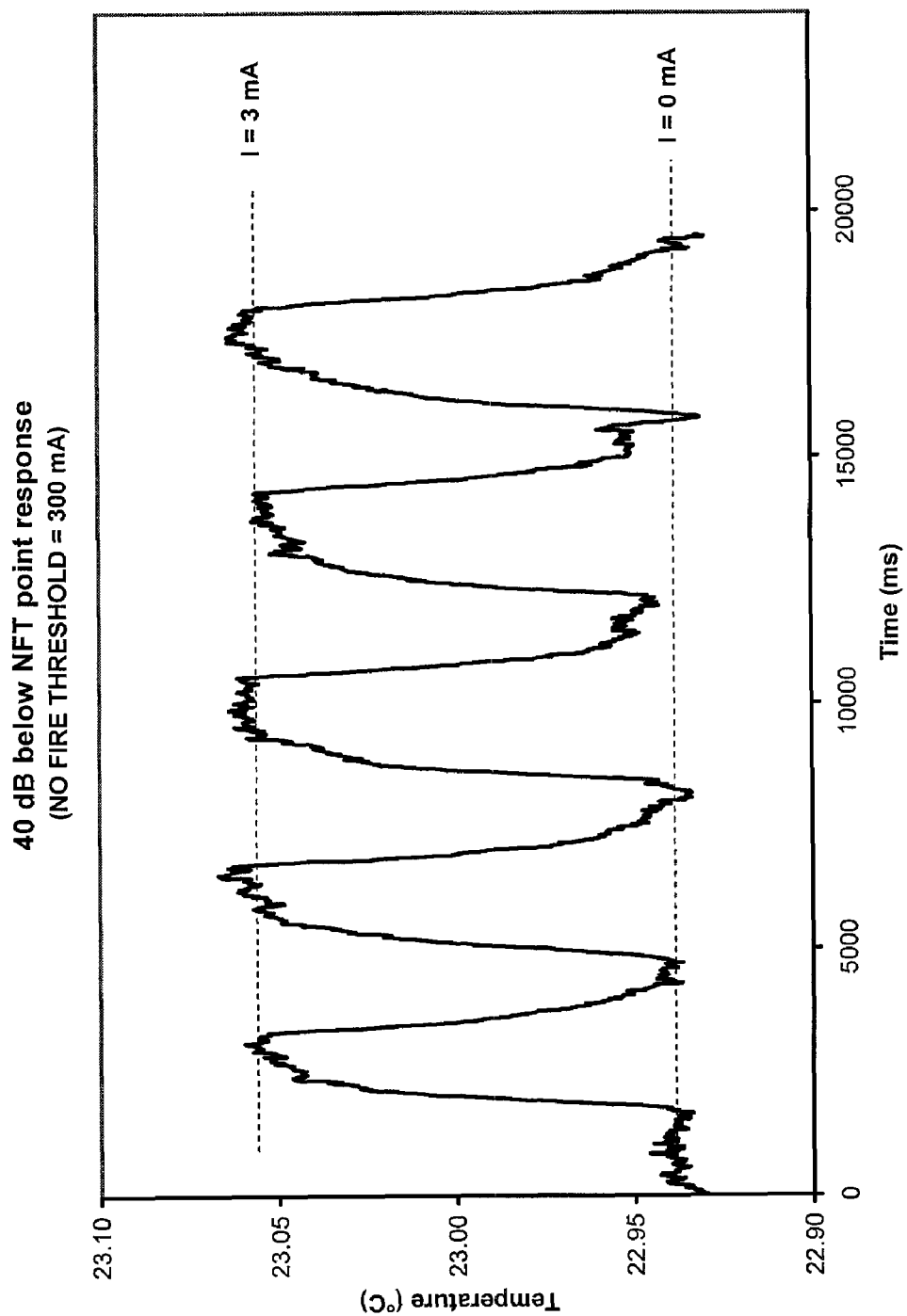
FIG. 8 is a graph illustrating the experimental measurement of the temperature response of the optical sensor to pulses of current at 40 dB below the no fire threshold point of a bridge-wire EED.

FIG. 6 shows experimental measurement results of the temperature response of the optical sensor of FIG. 5 in steady-state regime. It can be seen that the noise level is approximately 3 millikelvin rms. This very low noise level is obtained by using a digital signal processing technique based on adaptive filtering. FIG. 7 shows the results of the sensor temperature response versus the current applied to the bridge-wire. The response follows a square-law function as predicted by theoretical models. FIG. 8 shows the experimental results of the temperature response of the optical sensor for current level 40 dB below the no-fire threshold point of the bridge-wire EED. It can be observed that the response of the sensor is well above the noise level and therefore showing very good sensor sensitivity.

It is contemplated that, while the system illustrated herein is implemented in a reflection arrangement, the optical sensor could alternatively be used in transmission. Accordingly, in an alternative embodiment, the optical sensor is inserted between surfaces of two optical fibers, i.e. an input optical fiber for guiding the input light from a light source to the optical sensor and an output fiber for guiding light propagated in the optical sensor to an optical spectrum analyzer. A side face of the optical sensor can be put in contact with the monitored element rather then its back reflection surface as in the embodiment of FIG. 2.

While the optical current and power sensor system is illustrated herein for monitoring the electrical current or power in a bridge-wire of an electro-explosive device, one skilled in the art will appreciate that other applications can make use of the provided current/power sensor.

While the illustrated embodiment uses a spectrophotometer consisting of a broadband light source and an optical spectrum analyzer, alternative spectrophotometers are contemplated. For example, a spectrophotometer comprising a tunable light source and an optical detector could alternatively be used.

While illustrated in block diagrams as groups of discrete components communicating with each other via distinct data signal connections, it will be understood by those skilled in the art that the preferred embodiments may be provided by a combination of hardware and software components, with some components being implemented by a given function or operation of a hardware or software system, and some of the data paths illustrated being implemented by data communication within a computer application or operating system.

The embodiment(s) of the invention described above is(are) intended to be exemplary only. The scope of the invention is therefore intended to be limited solely by the scope of the appended claims.

We claim:

1. An optical sensor system for monitoring an electrical current or power in an element to be monitored, said optical sensor system comprising:
   an optical sensor having:
      a temperature sensitive element made of a semiconductor material having a transition in its optical absorption spectrum, a spectral position of said transition varying with temperature, said temperature sensitive element having a contact surface for being placed in thermal contact with a surface of a continuous portion of the element to be monitored;
      a distance between the temperature sensitive element and the surface of the continuous portion of the element to be monitored, thereby, ensuring that none of said electrical current or power in said element to be monitored is to flow within said optical sensor, whereby said temperature sensitive element is to sense a variation in temperature of the element to be monitored as caused by said electrical current or power;

an optical fiber for guiding light to said optical sensor and for collecting light propagated in said optical sensor;

a spectrophotometer for measuring an optical absorption spectrum of the propagated light; and a processing unit for determining said spectral position of said transition in the measured optical absorption spectrum, and for converting said spectral position into a measurement of said current or power.

2. The optical sensor system as claimed in claim 1, wherein said semiconductor material comprises a direct bandgap semiconductor material.

3. The optical sensor system as claimed in claim 1, wherein said semiconductor material comprises a silicon-based indirect bandgap semiconductor material.

4. The optical sensor system as claimed in claim 1, wherein said optical sensor has a light transmission surface, light entering said optical sensor from said light transmission surface being propagated in said temperature sensitive element and being reflected on said contact surface, back to said light transmission surface.

5. The optical sensor system as claimed in claim 1, wherein the distance is substantially occupied by a non-electrically conductive material on the contact surface of the temperature sensitive element.

6. The optical sensor system as claimed in claim 2, wherein said direct bandgap semiconductor material comprises an undoped gallium arsenide monocrystal.

7. The optical sensor system as claimed in claim 4, wherein said optical fiber has an end surface bonded to said light transmission surface.

8. The optical sensor system as claimed in claim 4, wherein said optical sensor has an antireflection coating on said light transmission surface.

9. The optical sensor system as claimed in claim 8, wherein said antireflection coating comprises a multilayer antireflection coating.

10. The optical sensor system as claimed in claim 5, wherein said optical sensor has a high reflection coating on said contact surface, between the temperature sensitive material and the non-electrically conductive material.

11. The optical sensor system as claimed in claim 10, wherein said high reflection coating comprises a multilayer high reflection coating.

12. The optical sensor system as claimed in claim 5, wherein the non-electrically conductive material comprises a thermally conductive adhesive.

13. An optical sensor system for monitoring an electrical current or power in a bridge-wire of an electro-explosive device, said optical sensor system comprising:

a bridge-wire for installation in the electro-explosive device;

an optical sensor having a temperature sensitive element made semiconductor material having a transition in its optical absorption spectrum, a spectral position of said transition varying with temperature, said temperature sensitive element having a contact surface placed in thermal contact with a surface of a continuous portion of the bridge-wire;

a non-electrically conductive material on the contact surface of the temperature sensitive element, distancing the temperature sensitive element from the surface of the continuous portion of the bridge-wire, thereby ensuring that none of said electrical current or power in said bridge-wire is to flow within said optical sensor, whereby said temperature sensitive element senses a variation in temperature of the bridge-wire as caused by said electrical current or power;

an optical fiber for guiding light to said optical sensor and for collecting light propagated in said optical sensor;

a spectrophotometer for measuring an optical absorption spectrum of the propagated light; and a processing unit for determining said spectral position of said transition in the measured optical absorption spectrum, and for converting said spectral position into a measurement of said current or power in said bridge-wire.

14. The optical sensor system as claimed in claim 13, wherein said temperature sensitive element comprises a direct bandgap semiconductor material.

15. The optical sensor system as claimed in claim 13, wherein said optical sensor has a light transmission surface, light entering said optical sensor from said light transmission surface being propagated in said temperature sensitive element and being reflected on said contact surface, back to said light transmission surface.

16. The optical sensor system as claimed in claim 14, wherein said semiconductor material comprises an undoped gallium arsenide monocrystal.

17. The optical sensor system as claimed in claim 15, wherein said optical fiber has an end surface bonded to said light transmission surface.

18. A method for monitoring at least one of an electrical current and an electrical power in an element to be monitored, said method comprising:

placing a contact surface of a temperature sensitive element in thermal contact with a surface of a continuous portion of the element to be monitored, and distanced from the surface of the continuous portion of the element to be monitored, a temperature of said monitored element being representative of said at least one of an electrical current and an electrical power in said monitored element;

guiding light to said temperature sensitive element and collecting light propagated in said temperature sensitive element using an optical fiber;

measuring an optical absorption spectrum of the propagated light;

determining a spectral position of a transition in the measured optical absorption spectrum, said spectral position varying with said temperature of said monitored element;

converting said spectral position into a measurement of said at least one of a current and a power using a known relation between said spectral position and said at least one of a current and a power; and outputting said measurement of said at least one of a current and a power.

19. The method as claimed in claim 18, further comprising:

receiving light in said optical sensor from a first surface of said optical sensor;

propagating the received light in said temperature sensitive element;

reflecting the propagated light on said contact surface; and outputting the reflected light from said first surface.

* * * * *